(12) United States Patent
Foletto et al.

(10) Patent No.: US 10,809,094 B2
(45) Date of Patent: Oct. 20, 2020

(54) MAGNETIC FIELD SENSOR HAVING COMPENSATION FOR MAGNETIC FIELD SENSING ELEMENT PLACEMENT

(71) Applicant: Allegro MicroSystems, LLC, Manchester, NH (US)

(72) Inventors: Andrea Foletto, Annecy le Vieux (FR); Rémy Lassalle-Balier, Bures sur Yvette (FR); Yannick Vuillermet, Voglans (FR); Paul A. David, Bow, NH (US); Jeffrey Eagen, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 242 days.

(21) Appl. No.: 15/883,721

(22) Filed: Jan. 30, 2018

(65) Prior Publication Data

US 2019/0234763 A1 Aug. 1, 2019

(51) Int. Cl.
| | | |
|---|---|---|
| *G01B 7/14* | (2006.01) | |
| *G01D 5/14* | (2006.01) | |
| *G01D 5/165* | (2006.01) | |
| *G01R 33/09* | (2006.01) | |
| *G01R 33/025* | (2006.01) | |

(52) U.S. Cl.
CPC ............ *G01D 5/145* (2013.01); *G01D 5/165* (2013.01); *G01R 33/025* (2013.01); *G01R 33/09* (2013.01); *G01R 33/093* (2013.01)

(58) Field of Classification Search
CPC .......... G01D 5/145; G01D 5/147; G01D 5/12; G01D 5/14; G01D 5/16; G01D 5/165; G01D 5/2457; G01D 5/2013; G01D 5/2046; G01D 5/24476; G01D 5/245; G01R 33/0017; G01R 33/025; G01R 33/07; G01R 33/0206; G01R 33/06; G01R 33/063; G01R 33/09; G01R 33/093; G01R 33/0052; G01R 33/18; G01N 27/9033; G01N 27/902; G01N 27/9013; G01N 27/904; G01N 27/223; G01N 27/82; G01N 27/9093

See application file for complete search history.

(56) References Cited

U.S. PATENT DOCUMENTS

| | | | |
|---|---|---|---|
| 6,107,793 | A | 8/2000 | Yokotani et al. |
| 9,719,806 | B2 | 8/2017 | Foletto et al. |
| 9,810,519 | B2 | 11/2017 | Taylor et al. |

(Continued)

FOREIGN PATENT DOCUMENTS

DE    10 2007 025 965 A1    12/2008

OTHER PUBLICATIONS

U.S. Non-Final Office Action dated Dec. 27, 2019 for U.S. Appl. No. 15/883,728; 12 Pages.

(Continued)

*Primary Examiner* — Thang X Le
(74) *Attorney, Agent, or Firm* — Daly Crowley Mofford & Durkee, LLP

(57) ABSTRACT

Methods and apparatus for a sensor system having a first magnetic field sensing element with first and second segments where the first and second segments are located at positions to generate magnetic field bias in opposite directions for reducing sensitivity due to misalignment of the first and second segments. A processing module is configured to receive an output of the magnetic field sensing element.

24 Claims, 14 Drawing Sheets

(56) References Cited

U.S. PATENT DOCUMENTS

| | | | |
|---|---|---|---|
| 9,823,092 B2 | 11/2017 | David et al. | |
| 9,880,026 B1 | 1/2018 | Eagen et al. | |
| 9,933,448 B1 | 4/2018 | Binder | |
| 2004/0257069 A1 | 12/2004 | Butzmann | |
| 2005/0280411 A1* | 12/2005 | Bicking | G01B 7/14 |
| | | | 324/207.21 |
| 2009/0015252 A1* | 1/2009 | Raberg | B82Y 25/00 |
| | | | 324/252 |
| 2012/0200292 A1* | 8/2012 | Sugihara | B82Y 25/00 |
| | | | 324/252 |
| 2016/0169984 A1 | 6/2016 | Werth et al. | |
| 2017/0205473 A1* | 7/2017 | Deak | G01R 33/09 |
| 2017/0276738 A1* | 9/2017 | Holm | G01R 33/091 |
| 2018/0335486 A1* | 11/2018 | Lassalle-Balier | G01R 33/093 |
| 2018/0364066 A1* | 12/2018 | Satz | G01D 5/14 |

OTHER PUBLICATIONS

U.S. Appl. No. 15/883,728, filed Jan. 30, 2018, Lassalle-Balier.

Response to U.S. Non-Final Office Action dated Dec. 27, 2019 for U.S. Appl. No. 15/883,728; Response filed on Jan. 9, 2020; 9 Pages.

PCT International Search Report and Written Opinion dated Feb. 27, 2019 for International Application No. PCT/US2018/067027; 13 Pages.

Response to U.S. Non-Final Office Action dated Apr. 15, 2020 for U.S. Appl. No. 15/883,728; Response filed Jul. 14, 2020; 15 Pages.

U.S. Non-Final Office Action dated Apr. 15, 2020 for U.S. Appl. No. 15/883,728; 15 Pages.

PCT International Preliminary Report on Patentability dated Aug. 13, 2020 for International Application No. PCT/US2018/067027; 8 pages.

* cited by examiner

Malignement on Y axis configuration

Centered configuration on Y axis

MAGNETIC FIELD SENSOR HAVING COMPENSATION FOR MAGNETIC FIELD SENSING ELEMENT PLACEMENT

BACKGROUND

Magnetic sensors are widely used in modern systems to measure or detect physical parameters, such as magnetic field strength, current, position, motion, orientation, and so forth. There are many different types of sensors for measuring magnetic fields and other parameters. However, such sensors suffer from various limitations, for example, excessive size, inadequate sensitivity and/or dynamic range, cost, reliability and the like. In addition, positional misalignment of a magnetic sensing element can degrade sensor performance.

SUMMARY

The present invention provides method and apparatus for magnetic field sensing element misalignment compensation in accordance with illustrative embodiments. In embodiments, a magnetic field sensor comprises a magnetic field sensing element that includes a single element, or a half or full bridge structure, with magnetic field sensing elements divided into segments subject to opposite magnetic field bias polarity so as to compensate for positional misalignment along at least one axis. In embodiments, magnetic field sensing elements are provided as GMR elements in half-bridge or a bridge configuration. In the presence of sensing element positional misalignment with respect to the field, a first segment of a GMR element will have increased or decreased sensitivity for a bias polarity and a second segment will have a decreased or increased sensitivity that is opposite of the first segment and an opposite bias polarity. The effects of misalignment are reduced due to compensation provided by the combination of the first and second segments that comprise one of the magnetic field sensing elements.

In one aspect, a sensor system comprises: a first magnetic field sensing element comprising first and second segments wherein the first and second segments are located at positions to generate magnetic field bias in opposite directions for reducing sensitivity due to misalignment of the first and second segments; and a processing module to receive an output of the magnetic field sensing element.

A sensor system can further include one or more of the following features: the misalignment is determined from a center of magnetic field generated by a magnet, the misalignment is due to the first and second segments being located at non-equal distances from the center of the magnet field, the first segment is subject to a stronger magnetic field and the second segment is subject to a weaker magnetic field as misalignment increases, and wherein the processing module is configured to combine signals from the first and second segments for reducing sensitivity due to misalignment of the first and second segments, the first magnetic field sensing element comprises a GMR split into two portions, the first and second magnetic field sensing elements are configured in half-bridge configuration, third and fourth magnetic field sensing elements, wherein the first, second, third, and fourth magnetic field sensing elements are configured in a bridge configuration, the third magnetic field sensing element comprises fifth and sixth segments and the fourth magnetic field sensing element comprises seventh and eighth segments, the first magnetic field sensing element comprises GMR elements, and/or the first magnetic field sensing element comprises TMR elements.

In another aspect, a method comprises: employing a first magnetic field sensing element comprising first and second segments wherein the first and second segments are located at positions to generate magnetic field bias in opposite directions for reducing sensitivity due to misalignment of the first and second segments; and employing a processing module to receive an output of the magnetic field sensing element.

A method can further include one or more of the following features: the misalignment is determined from a center of magnetic field generated by a magnet, the misalignment is due to the first and second segments being located at non-equal distances from the center of the magnet field, the first segment is subject to a stronger magnetic field and the second segment is subject to a weaker magnetic field as misalignment increases, and wherein the processing module is configured to combine signals from the first and second segments for reducing sensitivity due to misalignment of the first and second segments, the first magnetic field sensing element comprises a GMR split into two portions, the first and second magnetic field sensing elements are configured in half-bridge configuration, third and fourth magnetic field sensing elements, wherein the first, second, third, and fourth magnetic field sensing elements are configured in a bridge configuration, the third magnetic field sensing element comprises fifth and sixth segments and the fourth magnetic field sensing element comprises seventh and eighth segments, the first magnetic field sensing element comprises GMR elements, and/or the first magnetic field sensing element comprises TMR elements, In a further aspect a sensor system comprises: a first magnetic field sensing means comprising first and second segments wherein the first and second segments are located at positions to generate magnetic field bias in opposite directions for reducing sensitivity due to misalignment of the first and second segments; and a processing means to receive an output of the magnetic field sensing means. The misalignment may be determined from a center of magnetic field generated by a magnet. The misalignment may be due to the first and second segments being located at non-equal distances from the center of the magnet field.

BRIEF DESCRIPTION OF THE DRAWINGS

The foregoing features of this invention, as well as the invention itself, may be more fully understood from the following description of the drawings in which.

DETAILED DESCRIPTION

Figure 1:
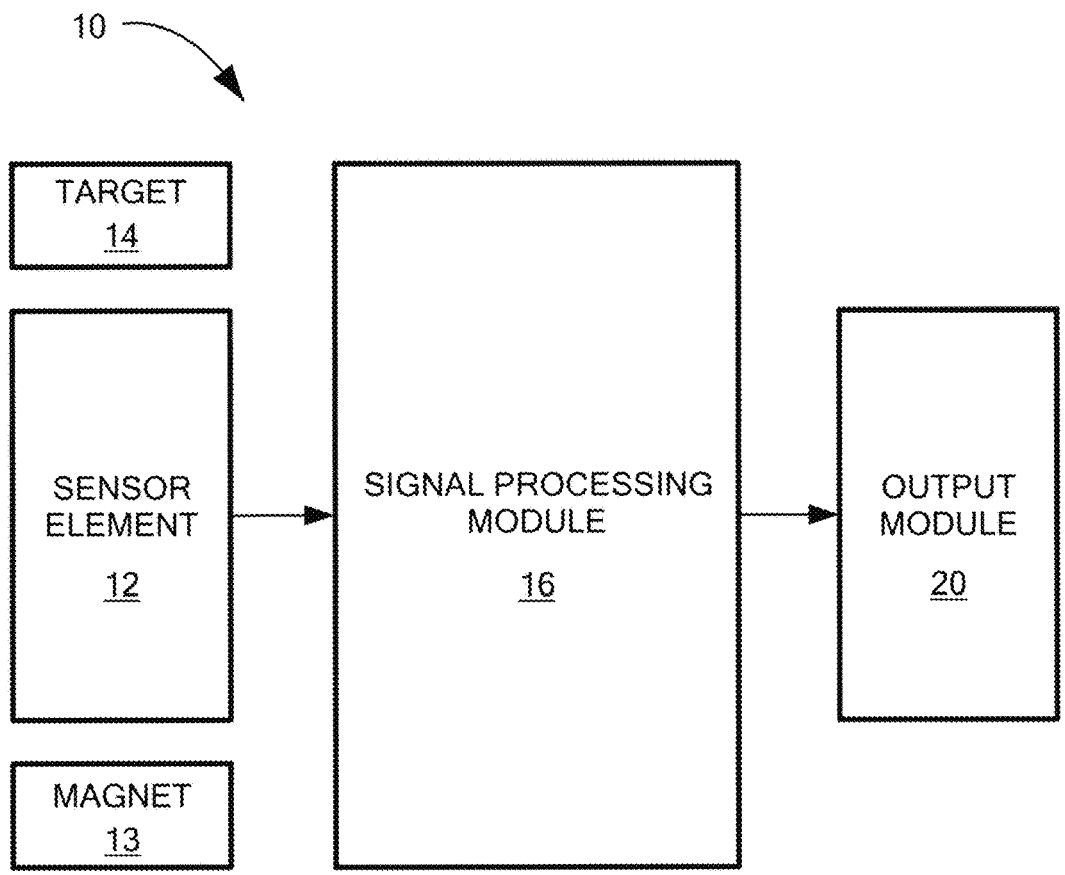
FIG. 1 is a block diagram of a sensor having compensation for magnetic field sensing element positional misalignment in accordance with example embodiments of the invention.

FIG. 1 is a circuit diagram illustrating an example of a magnetic field sensor 10 including a magnetic field sensing element 12 having bias misalignment compensation in accordance with illustrative embodiments of the invention. In embodiments, the magnetic field sensing element 12 can be positioned in relation to a magnet 13, for example. In embodiments, the magnetic field sensing element 12 senses a ferromagnetic target 14, for example, that causes changes in a magnetic field. A signal processing module 16 is coupled to the magnetic field sensing element 12 to process the signal from the sensing element. An output module 20 is coupled to the signal processing module 16 to provide an output signal for a device containing the magnetic field sensor.

Figure 1A:
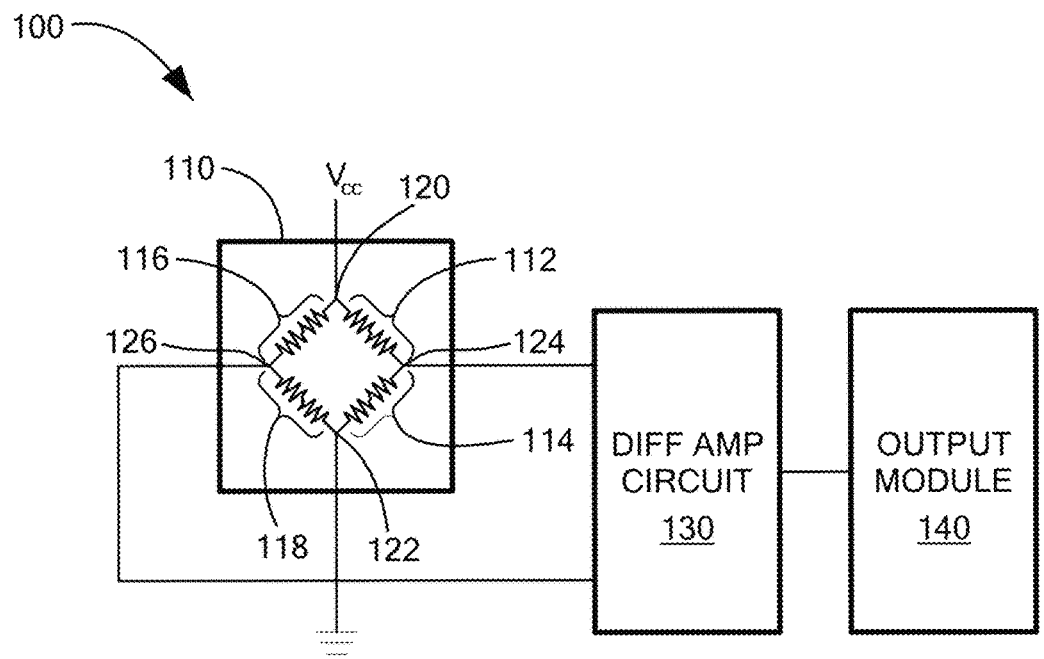
FIG. 1A shows a schematic representation of a sensor having a bridge configuration with compensation for magnetic field sensing element positional misalignment in accordance with example embodiments of the invention.

In one embodiment shown in FIG. 1A, the magnetic field sensing element 12 of FIG. 1 comprises a GMR magnetic field sensor 110 in the form of a bridge. The bridge circuit 110 includes magnetic field sensing elements, such as GMR elements 112, 114, 116, 118, disposed on the respective branches of the bridge 110. As shown, and described more fully below, the GMR elements 112, 114, 116, 118 can be divided into two or more segments to provide misalignment compensation.

In the illustrative embodiment, one end of the GMR element 112 and one end of the GMR element 116 are connected in common to a power supply terminal $V_{cc}$ via a node 120, one end of the GMR element 114 and one end of the GMR element 118 are connected in common to ground via a node 122. The other end of the GMR element 112 and the other end of the GMR element 114 are connected to a node 124, and the other end of the GMR element 116 and the other end of the GMR element 118 are connected to a node 126.

In the illustrated embodiment, node 124 of the bridge circuit 110 is connected to a differential amplifier circuit 130. Node 126 is also connected to the differential amplifier circuit 130. A first output of the differential amplifier circuit 130 is connected to an output module 140. In embodiments, Vcc can be used to compensate for gain changes of the GMR elements over process and temperature. It is understood that the differential amplifier circuit 130 can include offset trim to correct for GMR sensor mismatch and/or sensitivity trim to adjust gain over temperature and process.

The magnetic field sensing planes of the GMR elements 112, 116 and 114, 118 react to a magnetic field by corresponding resistances changes. GMR elements 112, 118 have maximum and minimum resistances at locations shifted in phase to that of GMR elements 114, 116. This is due to either how the magnetics of the system are configured and/or different pinning orientations of the elements. As a result, the voltages at the nodes 124, 126 (mid-point voltages) of the bridge circuit 110 also change in a similar fashion.

Magnetoresistance refers to the dependence of the electrical resistance of a sample on the strength of external magnetic field characterized as:

$$\delta_H = [R(0) - R(H)]/R(0)$$

where R(H) is the resistance of the sample in a magnetic field H, and R(0) corresponds to H=0. The term "giant magnetoresistance" indicates that the value $\delta_H$ for multilayer structures significantly exceeds the anisotropic magnetoresistance, which has a typical value within a few percent.

Giant magnetoresistance (GMR) is a quantum mechanical magnetoresistance effect observed in thin-film structures composed of alternating ferromagnetic and non-magnetic conductive layers. The effect is observed as a significant change in the electrical resistance depending on whether the magnetization of adjacent ferromagnetic layers are in a parallel or an antiparallel alignment. The overall resistance is relatively low for parallel alignment and relatively high for antiparallel alignment. The magnetization direction can be controlled, for example, by applying an external magnetic field. The effect is based on the dependence of electron scattering on the spin orientation. A bridge of four identical GMR devices is insensitive to a uniform magnetic field and is reactive when the field directions are antiparallel in the neighboring arms of the bridge.

Figure 2:
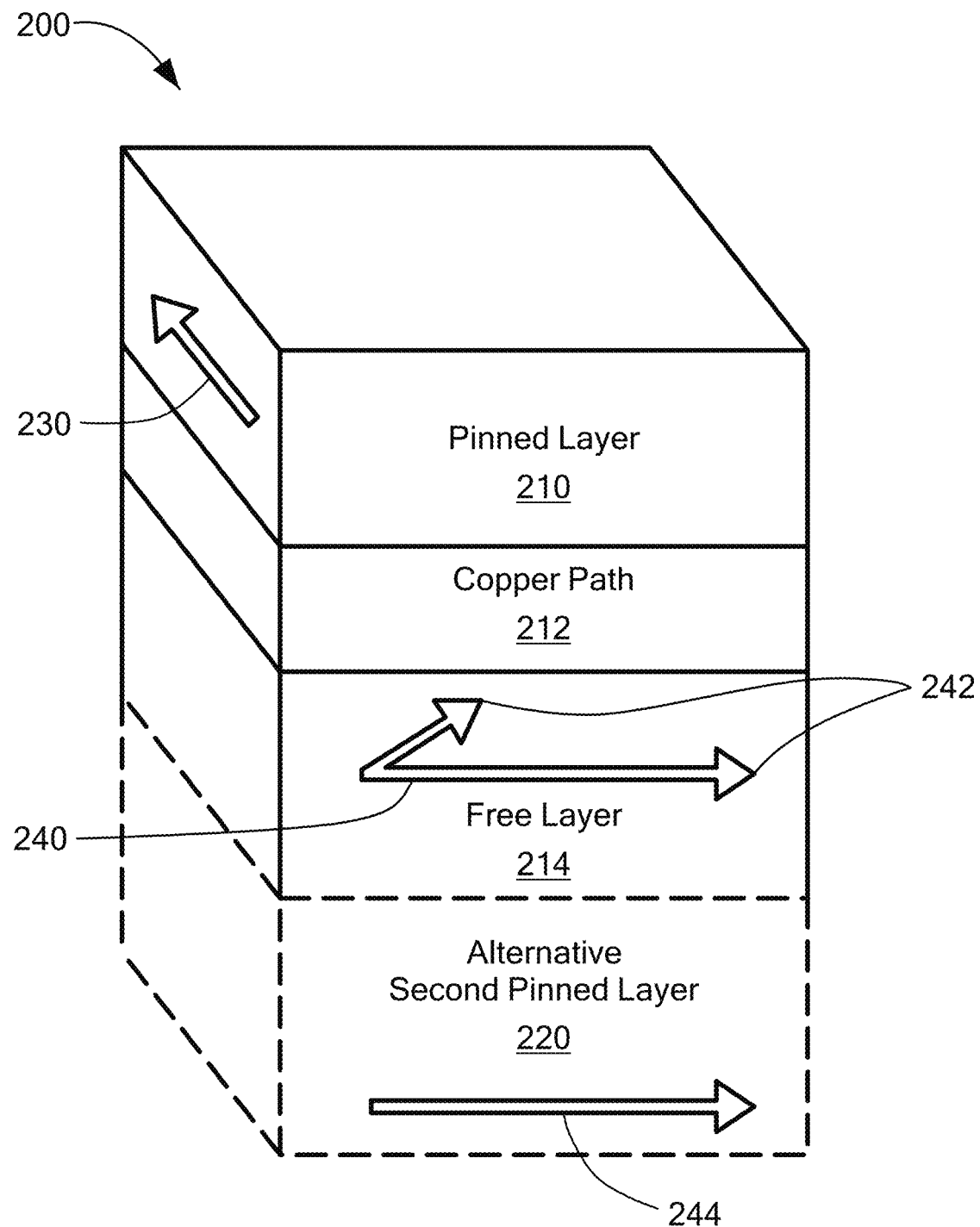
FIG. 2 shows an example GMR element layer configuration that can form a part of a sensor having GMR elements in a bridge configuration with compensation GMR element positional misalignment in accordance with example embodiments of the invention.

FIG. 2 illustrates a simplified GMR sensor 200 that can form a part of the magnetic field sensor 10 of FIG. 1 according to an embodiment. In FIG. 2, the GMR sensor 200 includes a pinned layer 210, a metal path 212, such as copper, and a free layer 214. The magnetic orientation of the pinned layer 210 is fixed. The magnetic orientation of the free layer 214 is maintained in a selected alignment through anisotropy or by the shown alternative second pinned layer 220, each of which provide a pinning field, $H_{an}$ 242 (FIG.

2b). The magnetic orientation of the free layer 214 rotates 242 based on the applied field.

As shown, anisotropy may be used to creates a 90° zero applied field orientation 240 of the free layer 220, or a 90° zero applied field orientation 240 may be provided with the second pinned layer 220, which is 90° to the pinned layer.

The sensitivity of a GMR (Giant Magnetoresistance) element used in a back bias environment depends on the magnetic bias (internal or external to the GMR structure). The bias induced by the magnet is typically not uniform and the GMR sensitivity changes with the position of the GMR with regards to the magnet such that placement tolerances may be a factor in the accuracy of the sensor.

Embodiments of the invention provide reduction in the effect of sensing element misalignment with respect to a magnet on GMR sensitivity by splitting a GMR structure into at least two segments and positioning a first GMR segment in a zone with positive bias and a second GMR segment in a symmetric zone with opposite bias. The zones are defined by one or more axes at least one of which may be aligned with a surface of the magnet and passing through a center of the magnet. In a configuration without misalignment, the first and second segments in zones of opposite bias will have the same magnitude of bias, therefore the same sensitivity. In the case of sensing element misalignment with respect to the field, the first segment will increase/decrease its bias with a consequent decrease/increase of sensitivity and the second segment will have the opposite behavior with decreasing/increasing bias with a consequent increase/decrease of sensitivity, as described more fully below. The first and second GMR segments attempt to compensate each other in sensitivity in the presence of misalignment of the GMR structure with respect to a bias magnet.

Figure 3B:
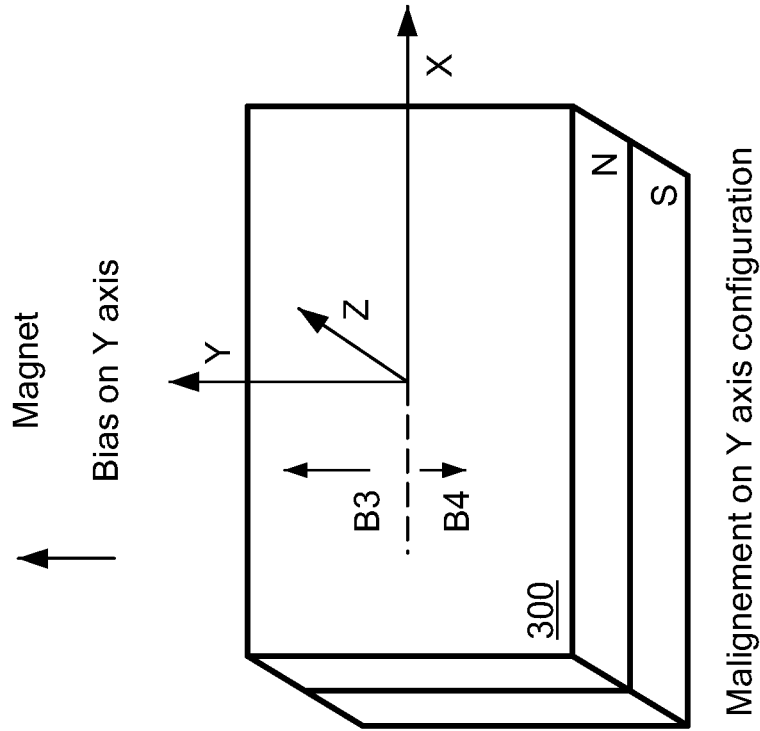
FIG. 3B shows a magnet and magnetic vectors with magnetic field sensing element misalignment.
Figure 3A:
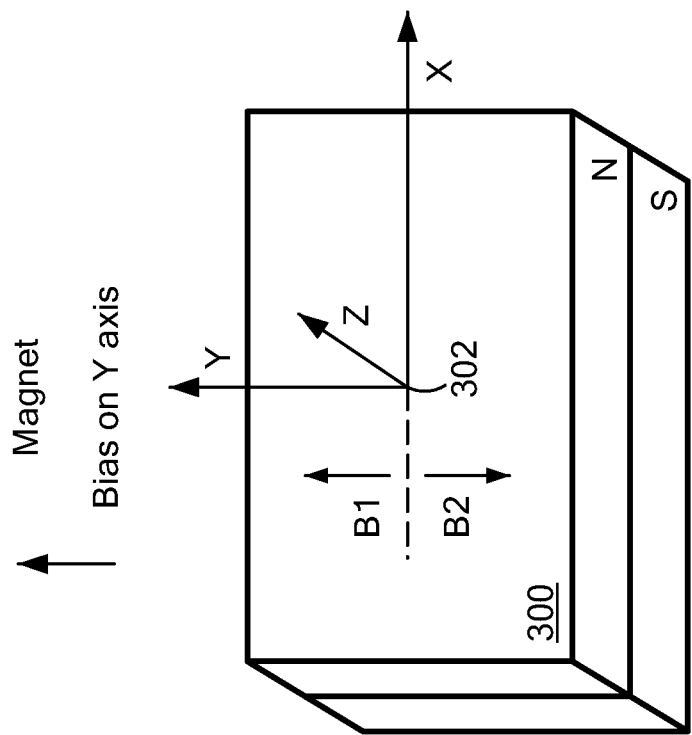
FIG. 3A shows a magnet and magnetic vectors without magnetic field sensing element misalignment.

FIGS. 3A and 3B show bias variations with respect to a magnet 300. Positioning is described using x, y, and z coordinates as shown. FIG. 3A shows a configuration with a magnetic field sensing element, which can be provided as a GMR element, that is centered about the Y axis where the magnetic field sensing elements has first and second segments subject to opposite field polarity. The magnet 300 generates a bias on the Y axis that is symmetric to bias on the X axis. For the purposes of simplicity, the zero coordinate 302 is placed at the center of the magnet 300. A point at coordinate "x1,y1" has a bias on Y axis equal and oppose to a point at coordinate "x1,-y1" so that the magnetic vector B1 is equal and opposite to magnetic vector B2. As can be seen the magnetic vector B1, B2 have the same length/magnitude and are located the same distance from the x-axis. The first segment can be located at "x1,y1" and the second segment can be located at "x1,-y1." In embodiments, the sensing element is centered with respect to the magnet.

Figure 7:
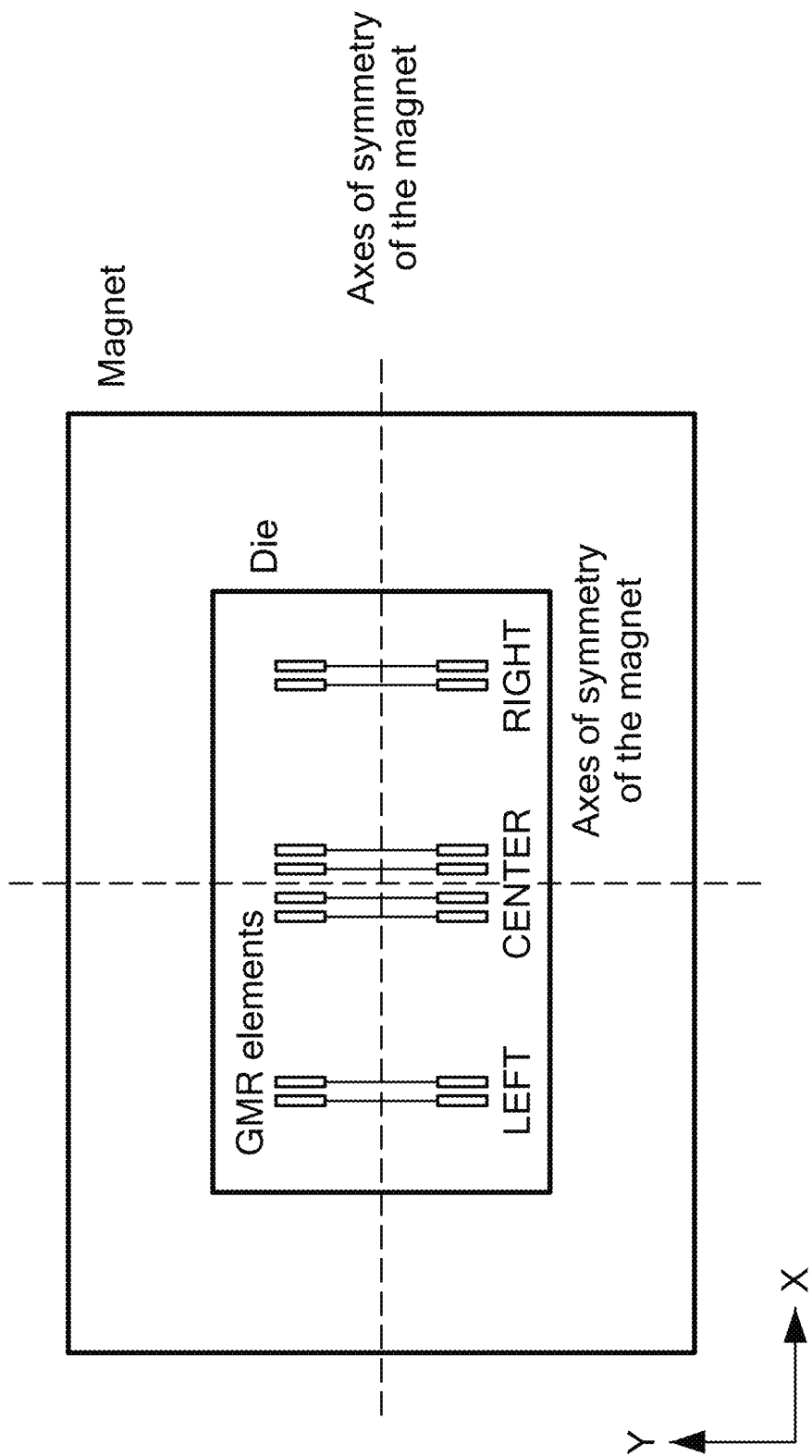
FIG. 7 is a schematic representation of a portion of a sensor having magnetic field sensing elements with segments at locations with respect to a magnet in accordance with illustrative embodiments of the invention.

FIG. 3B shows magnetic field sensing element misalignment along the Y axis. The Y axis magnitude increases (in absolute value) moving from the (x,y) center of the magnet in the Y direction. Due to the misalignment, magnetic vectors B3 and B4 have the same distance between them but are offset in the Y direction compared to magnetic vectors B1 and B2, which correspond to no Y-axis misalignment. The magnetic vector B3 is positioned further from the center of the magnet compared to B1 and has a stronger bias on the Y axis compare to B1. The magnetic vector B4 is positioned closer to the magnet center compared to B2 and has a weaker bias on the Y axis compared to B2. In embodiments, center is defined as the intersection of the axis of symmetry of the magnet as shown in FIG. 7. The fact that we have 0 field in the center is a consequence of the symmetry. Also if the magnet magnetization is tilted, there is no more 0 field point in the center.

It is understood that a GMR sensing element changes its resistance R roughly proportionally to the cosine of the magnetic vector according to this formula:

$$R \sim Hx/\mathrm{sqrt}(Hx^2+Hy^2),$$

where Hx is the magnetic field on the X axis, and Hy is the magnetic field on the Y aix. Hx is typically the 'useful' field. In the illustrated embodiment, the target moves along the X-axis (from left to right or vice-versa)

It will be this appreciated that a single GMR structure is therefore relatively insensitive to position on the Y axis because its component on Y axis is changing. A misalignment on the Y axis between the GMR structure and the magnet moves the GMR magnetic vector from B1 to B3 which may significantly affect the response of the GMR.

In embodiments, the GMR elements are segmented and positioned to compensate for misalignment. For example, a first segment can be positioned at coordinate "x1,y1" and a second segment can be positioned at coordinate "x1,-y1." Where there is no misalignment, the first and second GMR segments will have substantially the same response because they have the same distance from X, and thus, the same Hy field.

It is understood that the Hx magnetic field has been assumed to be similar in amplitude due to the same distance from the Y axis or due to the use of a magnet with a uniform field in the X axis. In case of misalignment of the GMR structure versus the magnet in the Y direction, the two segments will both move up or down. In such a case, when the first segment increases its bias on the Y axis the second reduces its bias on the Y axis to compensate for the first segment to a first approximation, and vice versa.

As shown above, a GMR element positioned to generate magnetic field vector B3 reduces its sensitivity due to the stronger field on the Y axis, but the GMR element positioned to generate magnetic vector field B4 increases its sensitivity due to the weaker field on the Y axis. The two sensitivities tend to compensate for the other so as to minimize the effect of y-axis misalignment.

Figure 4A:
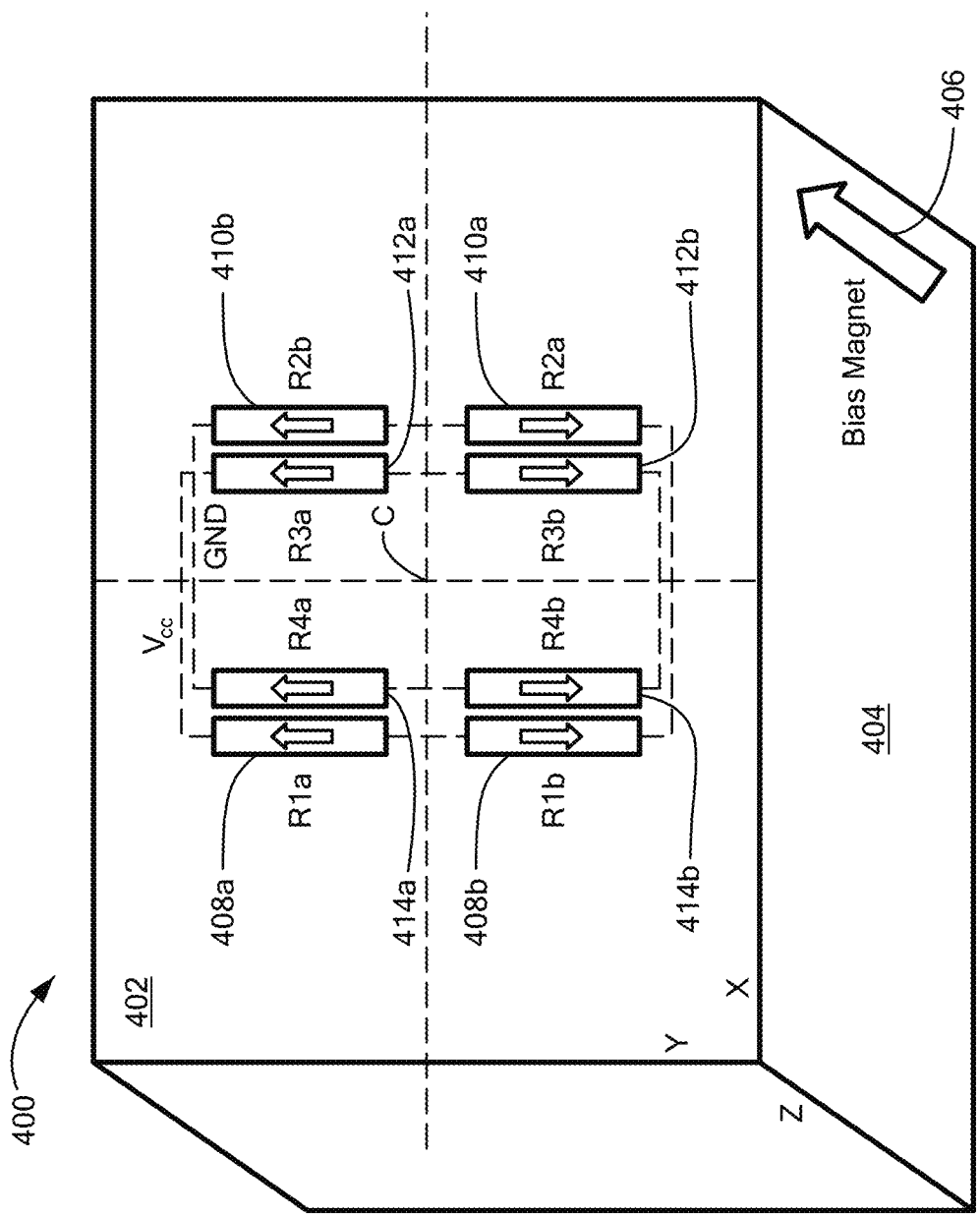
FIG. 4A shows a portion of a sensor having magnetic field sensing elements in a bridge configuration with segments at locations of opposite bias without misalignment in accordance with illustrative embodiments of the invention.

FIG. 4A shows an example system 400 having a GMR bridge 402 positioned with respect to a magnet 404 without misalignment. The magnetic field in the Z axis direction is shown by arrow 406. Note that the field in the X direction is not shown. A first GMR element 408 includes a first segment 408a and a second segment 408b, a second GMR element 410 includes a third segment 410a and a fourth segment 410b, a third GMR element 412 includes a fifth segment 412a and a sixth segment 412b, and a fourth GMR element 414 includes a seventh segment 414a and an eight segment 414b.

As compared to a conventional GMR bridge, the first GMR element 408 is divided into the first and second segments 408a,b, each of which has substantially equal bias magnitude that is opposite in polarity since there is no y-axis misalignment. Similarly, the segments of the second, third and fourth GMR elements are subject to substantially equal bias of opposite polarity.

In the illustrated embodiment, a voltage supply VCC can be coupled to the first segment 408a of the first GMR element 408a and the fifth segment 412a of the third GMR element, and electrical ground GND can be coupled to the seventh segment 414a of the fourth GMR element 414 and the fourth segment 410b of the second GMR element.

Figure 4B:
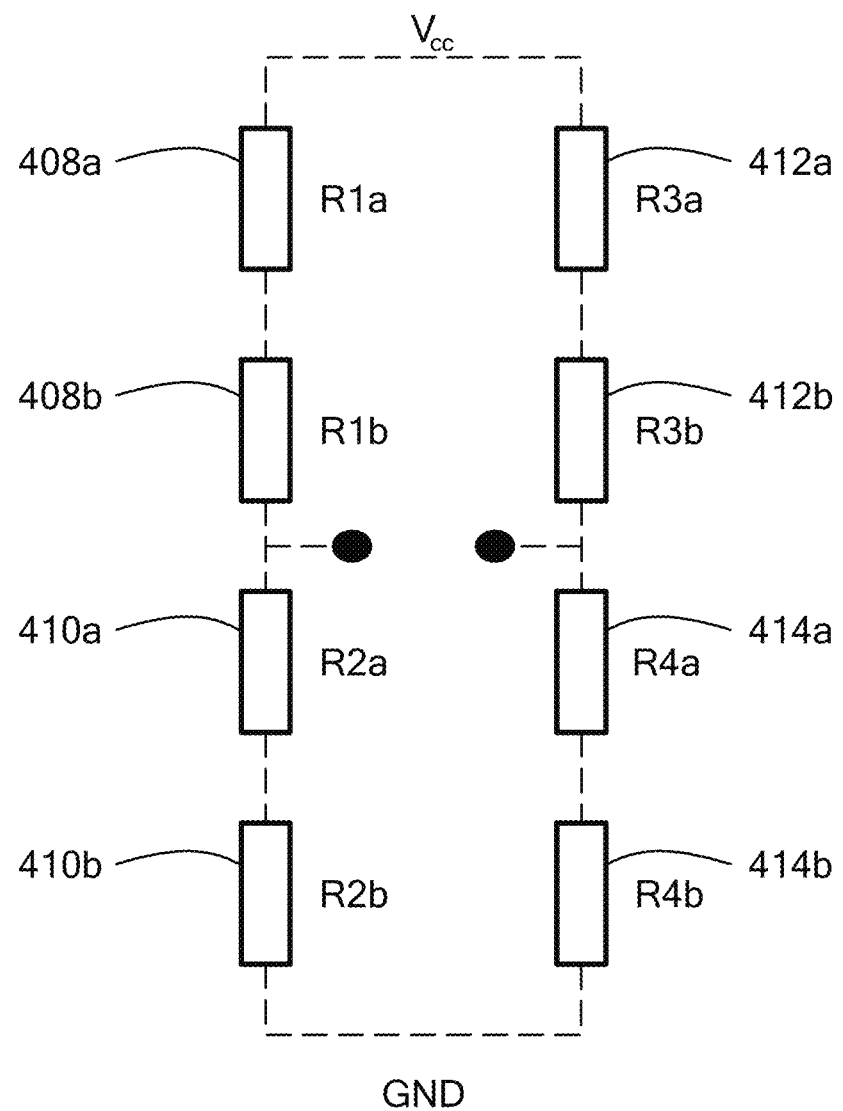
FIG. 4B shows an equivalent circuit for the sensor portion of FIG. 4A.

FIG. 4B shows an equivalent electrical circuit showing the segment connections to VCC and GND. It is understood that VCC and GND can be coupled to the GMR elements in a variety of configurations to meet the needs of a particular application.

Figure 4C:
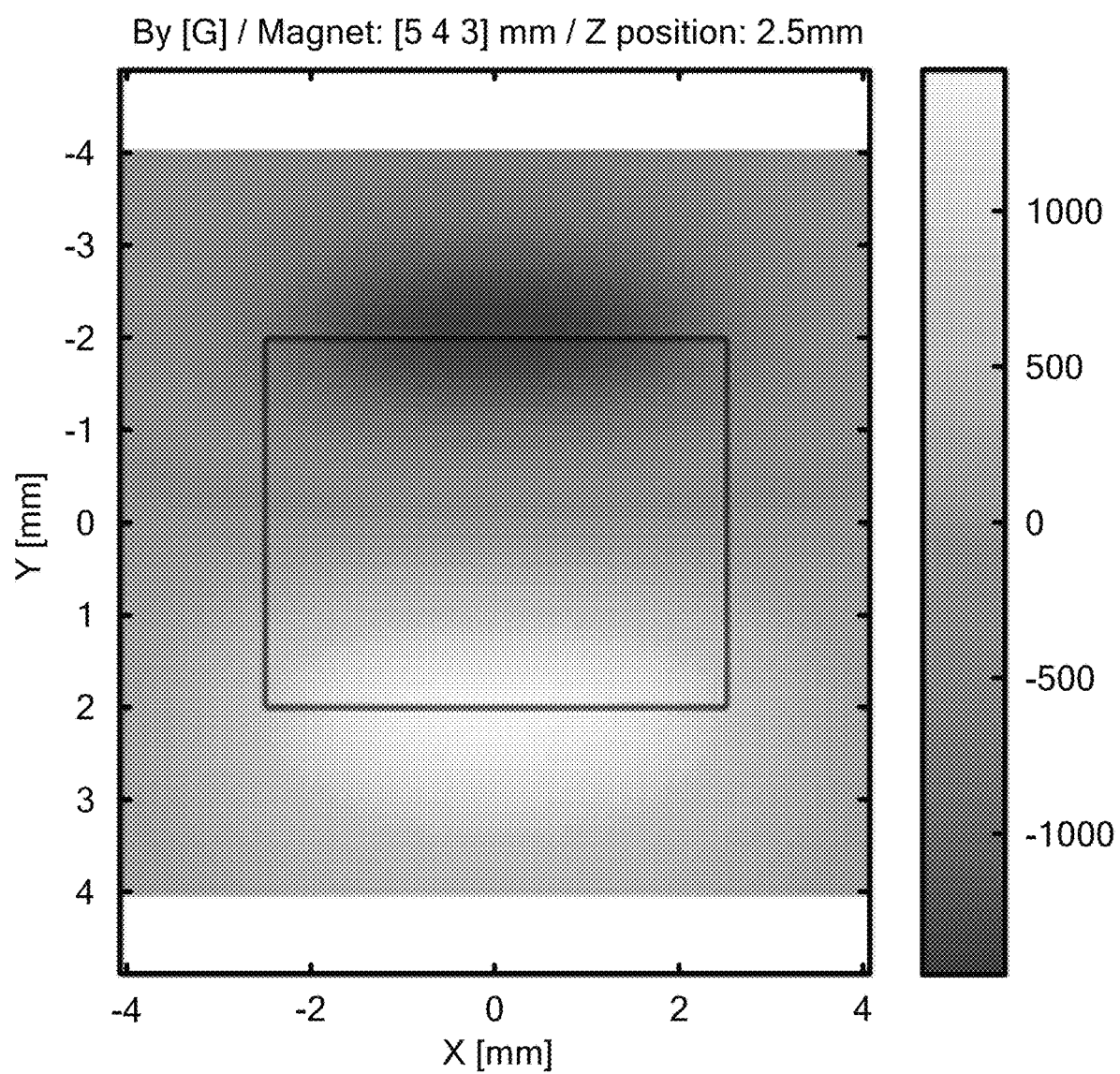
FIG. 4C shows a heat map of a magnetic field Hy (along Y axis) produced by a magnet in the plane XY.

FIG. 4C shows an example heat map of the magnetic field Hy (along Y axis) produced by an example magnet of dimension (X;Y;Z)=(5;4;3)mm in the plane XY that is distant from the magnet by 2.5 mm. The rectangle indicates the position of the magnet in the XY plane. Units are mm for X and Y and Oersted for the field. In the center, the map shows a gradient of Hy field along the Y axis with negative field for Y<0 and positive field for Y>0. The Hy field is relatively constant over the X axis.

Figure 5:
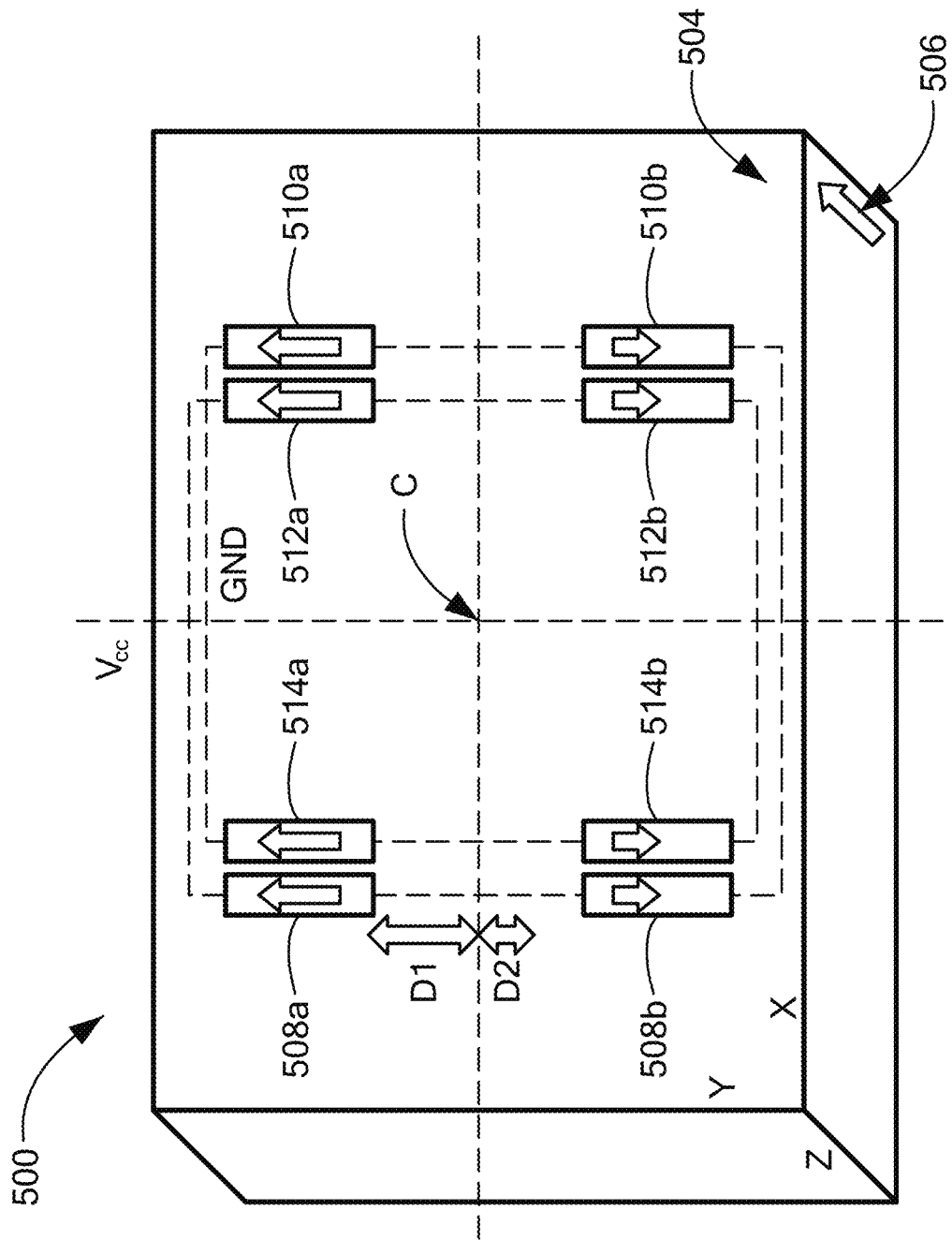
FIG. 5 shows a portion of a sensor having magnetic field sensing elements with segments at locations of opposite bias with misalignment in accordance with illustrative embodiments of the invention.

FIG. 5 shows an example system 500 having a GMR bridge 502 positioned with respect to a magnet 504 with Y-axis sensing element/magnet misalignment. The magnetic field in the Z axis direction is shown by arrow 506. A first GMR element 508 includes a first segment 508a and a second segment 508b, a second GMR element 510 includes a third segment 510a and a fourth segment 510b, a third GMR element 512 includes a fifth segment 512a and a sixth segment 512b, and a fourth GMR element 514 includes a seventh segment 514a and an eight segment 514b.

As can be seen, the distances D1, D2 from the x-axis to the first segment 508a and to the second segment 508b of the first GMR element 508 are different. In embodiments, the respective segments of the second, third, and fourth elements are also spaced at different distances from the x-axis.

Since the second segment 508b of the first GMR element 508 is closer to the center C of the magnet than the first segment 508a, the second segment has higher sensitivity to the magnetic field than the first segment. Where the first and second segments 508a,b are connected in electrical series, the total sensitivity of the first GMR element comprises the combined sensitivity of the first and second segments 508a, b.

In one embodiment, to a first approximation, the increased sensitivity of the second segment 508b of the first GMR element 508 compensates for the decreased sensitivity of the first segment 508a due to Y direction misalignment since $\delta R=\delta Hx/sqrt(Hx0^2+Hy^2)$ where $\delta R$ is the amplitude of the signal, $\delta Hx$ is the variation of the field along X axis that generate the signal; Hx0 is the static field along X and Hy is the static field along Y. When Hy increases signal decreases, when Hy decreases, signal increases.

Figure 6:
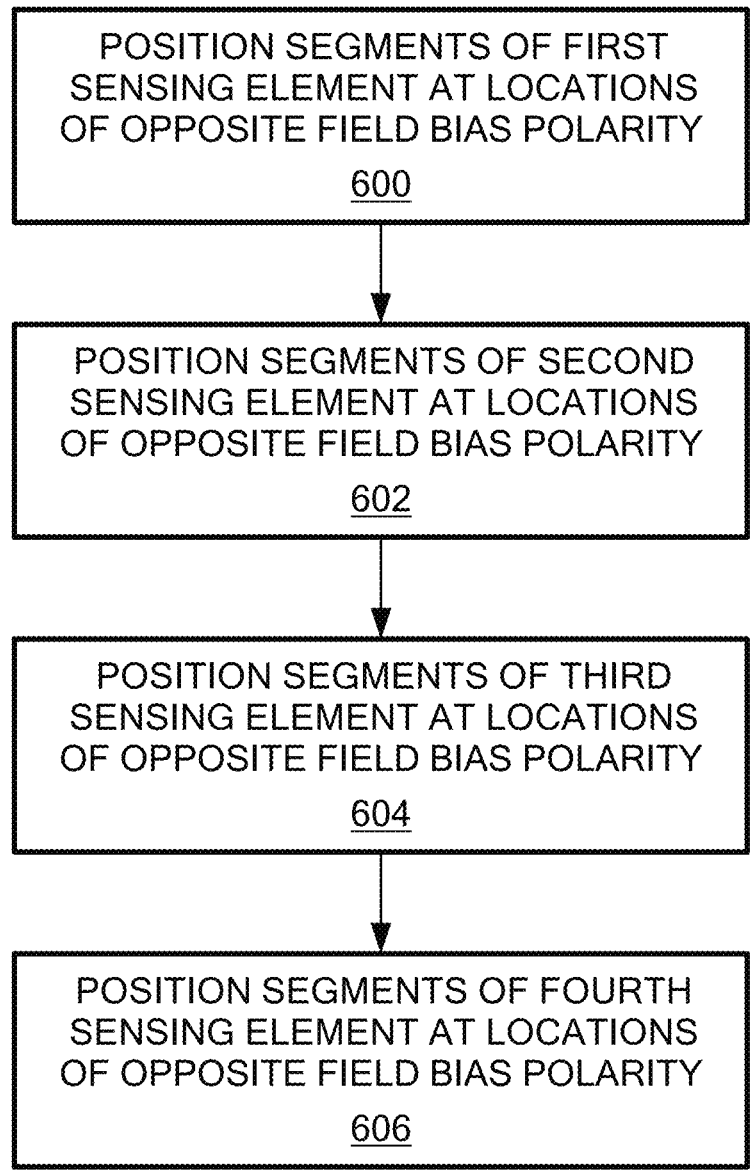
FIG. 6 is a flow diagram showing an example sequence of steps for providing magnetic field sensing elements with segments at locations of opposite bias with misalignment in accordance with illustrative embodiments of the invention.

FIG. 6 shows an example sequence of steps for providing misalignment compensation in accordance with example embodiments. The steps of FIG. 6 can be understood in conjunction with the example embodiment of FIG. 5. In step 600, segments of a first magnetic field sensing element are positioned at locations of opposite field bias provided by a magnet. In embodiments, magnetic field sensing elements are configured in a bridge. In embodiments, the magnetic field sensing elements comprise GMR elements.

In step 602, segments of a second magnetic field sensing element are positioned at locations of opposite field bias. In step 604, segments of a third magnetic field sensing element are positioned at locations of opposite field bias. In step 606, segments of a fourth magnetic field sensing element are positioned at locations of opposite field bias provided by a magnet. As described above, segments of a magnetic field sensing element at locations of opposite bias compensate for positional misalignment of the elements with respect to a magnetic field, which can be provided by a bias magnet.

While example embodiments are shown and described in conjunction with GMR elements, it is understood that other types of MR elements can be used, such as TMR elements.

FIG. 7 shows an example embodiment of a back bias 'speed' sensor having first and second bridges with three groups of GMR elements (left, center, right) with the GMR elements placed in relation to a magnet for removing sensitivity to the common mode field and alignment bias. The GMR elements are subject to opposite bias. The sensor provides speed and direction information of a target with first and second bridges having GMR elements located in different X positions, as shown. Due to the symmetry of the sensor, when the die and the magnet are perfectly aligned, a symmetric bridge has the GMR elements subject to same bias. Therefore, the sensor is immune to stray fields when the die and magnet are perfectly aligned.

Figure 8:
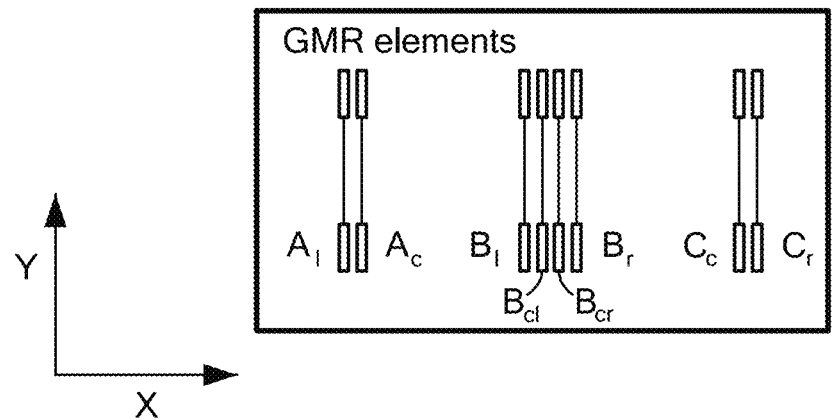
FIG. 8 is a schematic representation of a portion of a sensor having magnetic field sensing elements and FIG. 8A shows a circuit representation of left and right bridges formed by the magnetic field sensing elements of FIG. 8.
Figure 8A:
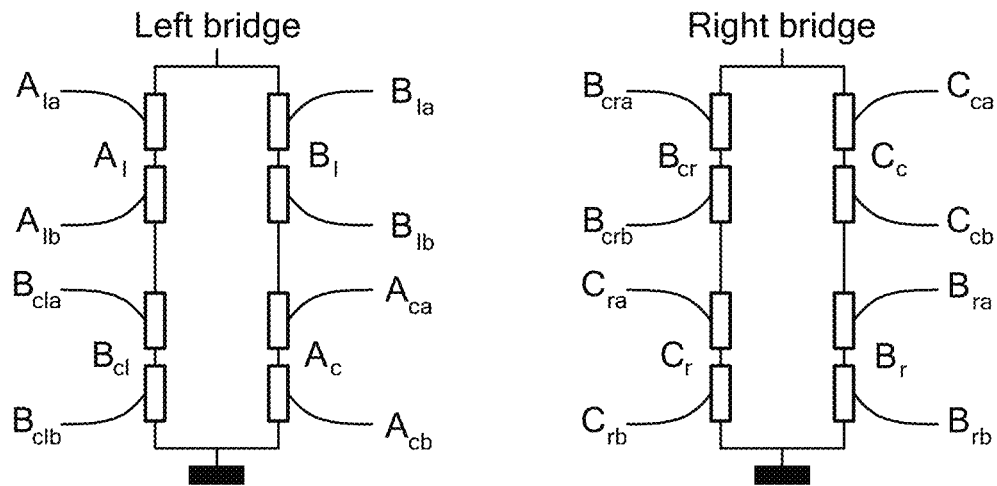
Figure 8B:
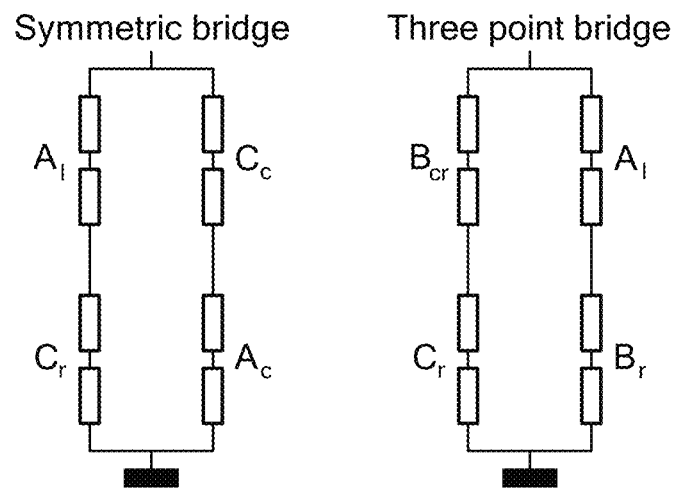
FIG. 8B shows symmetric and three-point bridges formed by the magnetic field sensing elements of FIG. 8.

FIG. 8 shows a sensor having GMR elements and FIGS. 8A and 8B show alternative bridge constructions in which GMR elements are subject to opposite bias. FIG. 8 shows first and second GMR bridges each having four elements where each element has first and second segments. FIG. 8A shows the left bridge and right bridge for bridges in the sensor of FIG. 8. Output signals in the left and right bridges can be used to determine speed and direction information. In one embodiment, subtraction and sum of signals in the left and right bridges outputs speed and direction information. The GMR elements are labeled such that subscription 1 refers to left, r refers to right, and c refers to center. Looking to FIG. 8, yokes Ax and Cx may be referred to a outer yoke Bx may be referred to as central or inner yokes. From left to right in FIG. 8, the GMR elements are listed as $A_l$, $A_c$, $B_l$, $B_{cl}$, $B_{cr}$, $B_r$, $C_c$, $C_r$. As seen in the left bridge of FIG. 8A, GMR element Ai includes first and second segments $A_{la}$, $A_{lb}$, the GMR element $B_{cl}$ includes third and fourth elements $B_{cla}$, $B_{clb}$, and so on.

In this arrangement, the segments of the GMR elements do not experience the exact same bias conditions. For example, the bias field, which can be generated by a magnet, along Z axis (FIG. 8) varies slightly between inner and outer yoke. This produces a difference in sensitivity of the elements, resulting in a global sensitivity to common mode field.

FIG. 8B shows symmetric and three point bridge configurations that may be useful for a back bias speed sensor. In an embodiment, the symmetric bridge of $A_l$, $C_c$, $C_r$, and $A_c$, can be referred to as a direction channel and the three point bridge can be referred to as a speed channel. Yokes $A_x$ and $C_x$ can be referred to as outer yokes and yokes $B_x$ can be referred to as central or inner yokes (see FIG. 8).

In embodiments, yokes should be placed by pairs in a symmetric manner respective to the magnet. One yoke should be placed at a position +Yp and the second Ym=−Yp (assuming Y=0 is at the center of the magnet). Then the spacing S (e.g., 2*Yp) is selected high enough so that the bias due to the magnet is large enough to ensure a proper compensation of the misplacement along Y axis and stray field along that same axis and small enough to ensure the sensitivity is not too diminished for a far air gap signal. In embodiments, there is compensation for bias of the GMR and good tolerance to misplacements over airgap.

Figure 9A:
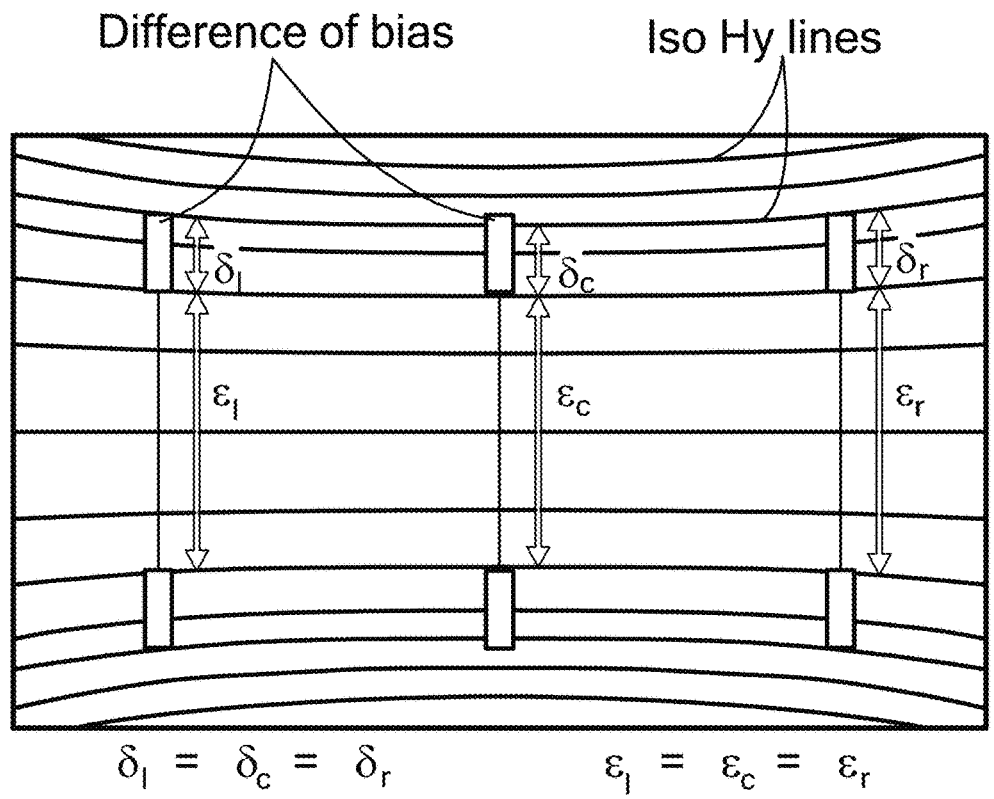
FIG. 9A is a schematic representation of magnetic field sensor having magnetic field sensing elements and segments positioned in relation to a field of a magnet.
Figure 9B:
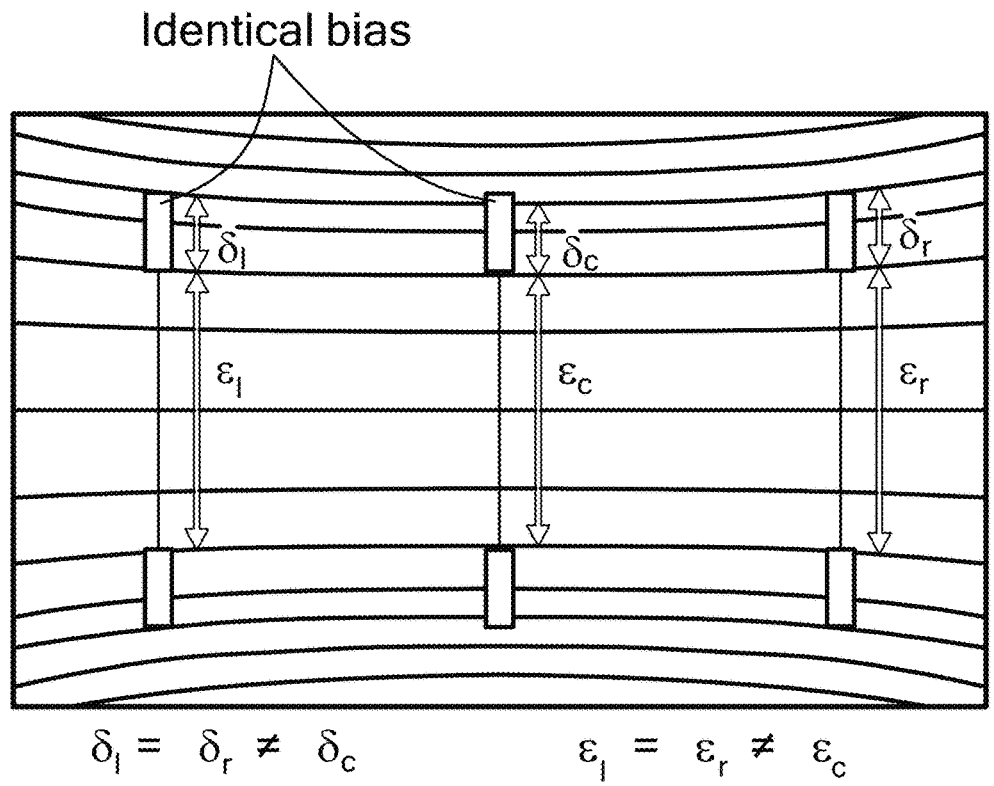
FIG. 9B is a schematic representation of magnetic field sensor having magnetic field sensing elements and segments dimensioned and/or spaced in relation to a field of a magnet.
Figure 9C:
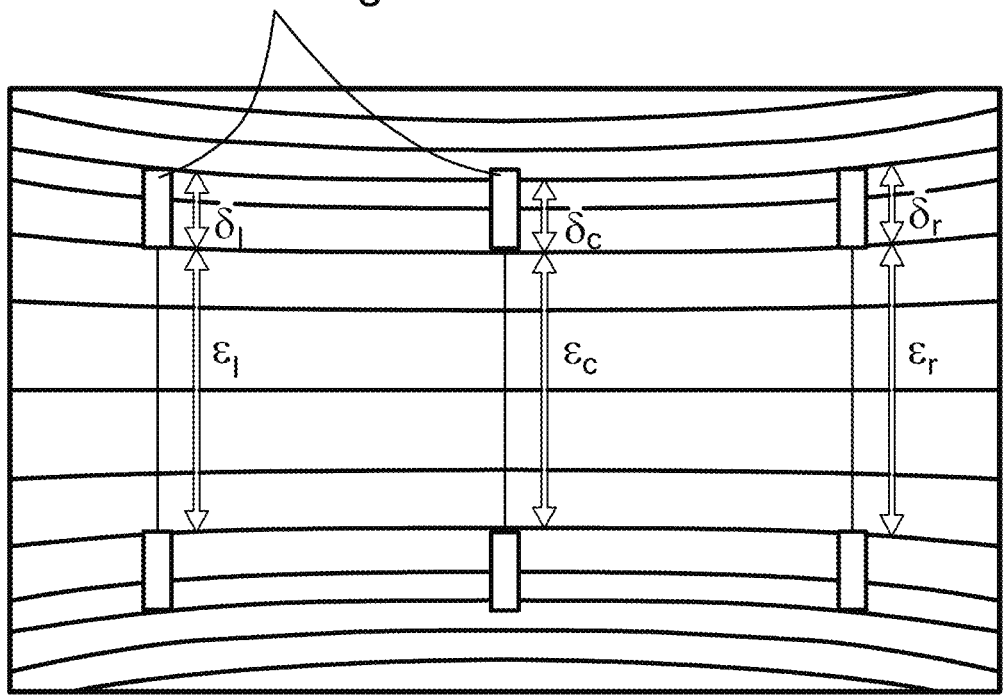
FIG. 9C is a schematic representation of magnetic field sensor having magnetic field sensing elements and segments dimensioned and/or spaced in relation to a field of a magnet.

As shown in FIGS. 9A and 9B, to promote substantially equal bias on the GMR elements, the GMR elements and segments can be dimensioned and/or spaced according to the iso-lines of bias field along the axis perpendicular to the reference direction, i.e. HyHy. As can be seen, in the example embodiment, there is a left GMR element, a center GMR element and a right GMR element, each having first and second segments. The left and right GMR elements are subject to different bias fields than the center elements as indicated by the iso-lines. The distance between the first and second segments of the left GMR element is $\varepsilon_l$ and the length of the segment is $\delta_l$. The distance between the segments of the center GMR element is $\varepsilon_c$ and the length of the segment is $\delta_c$. The distance between the first and second segments of the right GMR element is $\varepsilon_r$ and the length of the segment is $\delta_r$. In the illustrated embodiment of FIG. 9A, $\delta_l=\delta_r=\delta_c$ and $\varepsilon_l=\varepsilon_r=\varepsilon_c$. In the illustrated embodiment of FIG. 9B, $\delta_l=\delta_r\neq\delta_c$ and $\varepsilon_l=\varepsilon_r\neq\varepsilon_c$, as the center segment spacing and dimensions are different than the left and right segment spacing and dimension. In embodiments, $\delta_c$ is chosen so that HyHy at the bottom of the upper yokes is the same on all left, center and right yokes. And HyHy at the top of the upper yokes is the same on all left, center and right yokes. In embodiments, the yokes are all the same size and only the vertical spacing changes. The spacing is chosen so that the average HyHy value across the central yoke is the same as on the sides. FIG. 9C shows identical average bias on the elements.

It is understood that the length of the segments and distance between segments can be unique and can be configured to meet the needs of a particular application.

The arrangement of FIG. 9B, for example, distributes substantially equal bias through the GMR bridge elements. To keep the same sensitivity, central yokes and outer yokes should have the same resistance in absence of any magnetic field. As the square resistance of the stack forming the GMR elements is the same and the vertical length is fixed, zero field resistance can be adapted by adapting the GMR element width and/or adding a GMR segment placed right beside an existing element. Such elements can be connected either in series or in parallel with existing elements. To this end, the sensitivity in Ω/Oe can be made substantially equal between each GMR element (when both the die and the magnet are perfectly aligned).

Figure 10:
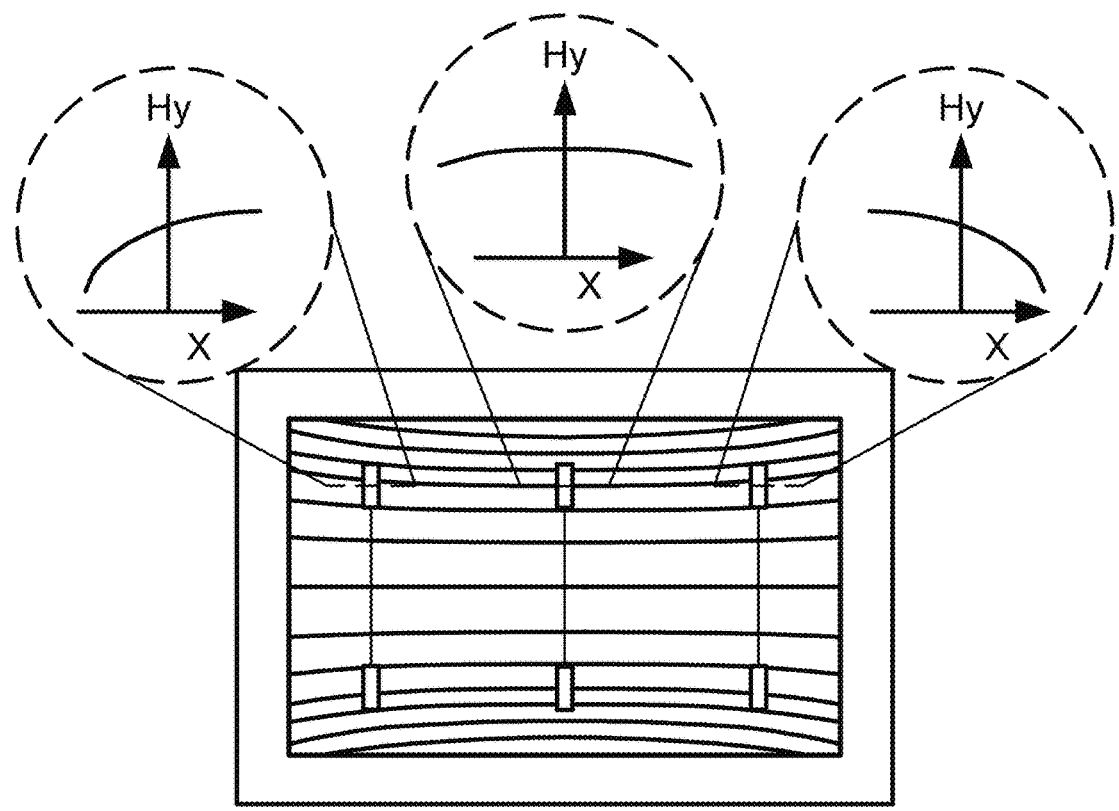
FIG. 10 is a schematic representation of bias seen by example magnetic field sensing segments.

In another aspect, a bias magnet can be shaped to decrease the sensitivity to the common mode field over X axis misplacement of the sensor elements. As shown in FIG. 10, for a rectangular magnet cross section, bias HyHy can vary significantly when misplacement in the X axis occurs, as shown. Thus, due to sensor element misplacement, the sensor starts to be sensitive to stray field. The bias Hy is shown for the upper segment of the left element, the upper segment of the center element, and the upper segment of the right element for the embodiment of FIG. 9B in which the center element segments are spaced and dimensioned differently than the left and right element segments.

Figure 10A:
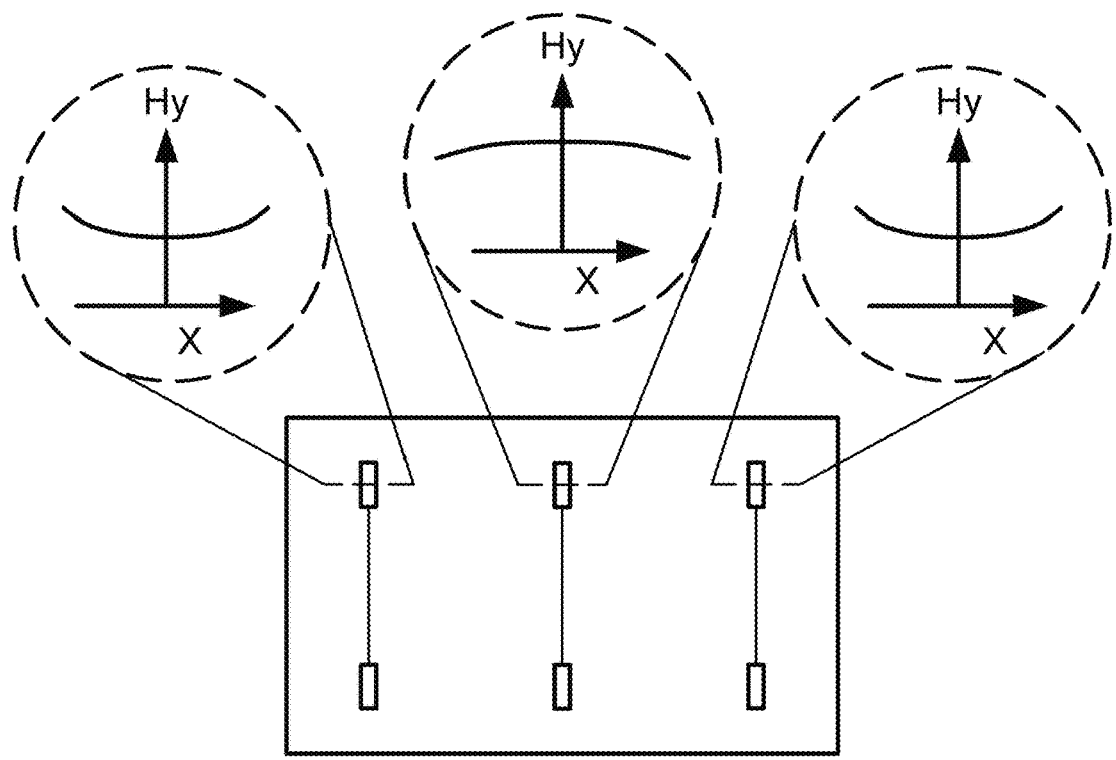
FIG. 10A is a schematic representation of bias seen by example magnetic field sensing segments for a shaped magnet.
Figure 11:
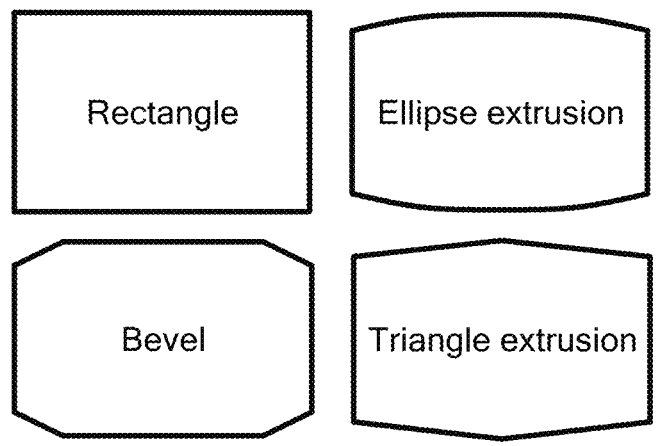
FIG. 11 shows example magnet shapes for magnetic field sensor.

As shown in FIG. 10A, by changing the cross section of the magnet in the XY plane from square to, for example, a bevel perimeter shown in FIG. 11, the slope of the bias Hx at which the GMR elements are located can be decreased, and may approach zero. When X-axis misplacement occurs, the bias does not change significantly. Therefore, sensitivity to stray field does not vary significantly through a range of X misplacement. In an ideal position, one is in the center and as soon as there is misalignment on X the 3 moves in such direction but because the profile is flat (slope is null) they still work as we are in the middle. Thus, there is good immunity to misalignment because there is no change. In embodiments, Hy depends on the distance to the top/bottom edge of the magnet. The closer to the edge, the higher Hy is. By reducing the height of the magnet on the sides we get these top and bottom edges closer to the yokes so that Hy increases again. That is how the function changes from something going down to 0 to something increasing again.

As used herein, the term "magnetic field sensing element" is used to describe a variety of electronic elements that can sense a magnetic field. The magnetic field sensing element can comprise, but is not limited to, a Hall Effect element, a magnetoresistance element, and/or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, a magnetic tunnel junction (MTJ), and a spin-valve. The magnetic field sensing element may be a single element or, alternatively, may include two or more magnetic field sensing elements arranged in various configurations, e.g., a half bridge or full bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 12:
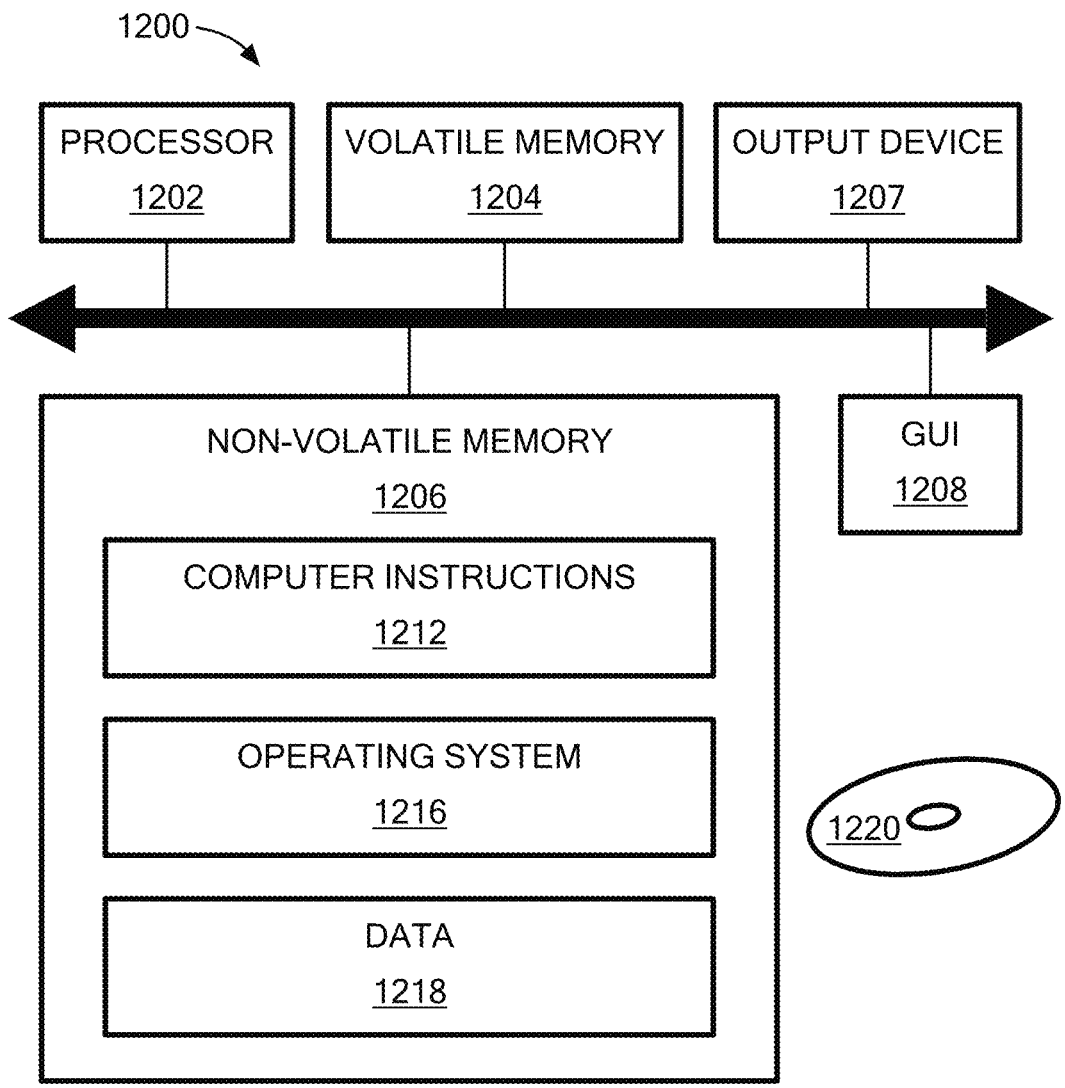
FIG. 12 is a schematic representation of an example computer that can perform at least a portion of the processing described herein.

FIG. 12 shows an exemplary computer 1200 that can perform at least part of the processing described herein. The computer 1200 includes a processor 1202, a volatile memory 1204, a non-volatile memory 1206 (e.g., hard disk), an output device 1207 and a graphical user interface (GUI) 1208 (e.g., a mouse, a keyboard, a display, for example). The non-volatile memory 1206 stores computer instructions 1212, an operating system 1216 and data 1218. In one example, the computer instructions 1212 are executed by the processor 1202 out of volatile memory 1204. In one embodiment, an article 1220 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensor system, comprising:
a first magnetic field sensing element comprising first and second segments wherein the first and second segments are located at positions to receive a magnetic field bias in opposite directions for reducing sensitivity due to misalignment of the first and second segments; and
a processing module to receive an output signal of the magnetic field sensing element.

2. The sensor system according to claim 1, wherein the misalignment is determined from a center of magnetic field generated by a magnet.

3. The sensor system according to claim 1, wherein the misalignment is due to the first and second segments being located at non-equal distances from the center of the magnet field.

4. The sensor system according to claim 1, wherein the first segment is subject to a stronger magnetic field and the second segment is subject to a weaker magnetic field as misalignment increases, and wherein the processing module is configured to combine signals from the first and second segments for reducing sensitivity due to misalignment of the first and second segments.

5. The sensor according to claim 1, wherein the first magnetic field sensing element comprises a GMR split into two portions.

6. The sensor according to claim 5, wherein the first magnetic field sensing element and a second magnetic field sensing element are configured in half-bridge configuration.

7. The sensor system according to claim 5, further including third and fourth magnetic field sensing elements, wherein the first, second, third, and fourth magnetic field sensing elements are configured in a bridge configuration.

8. The sensor system according to claim 7, wherein the third magnetic field sensing element comprises fifth and sixth segments and the fourth magnetic field sensing element comprises seventh and eighth segments.

9. The sensor system according to claim 1, wherein the first magnetic field sensing element comprises GMR elements.

10. The sensor system according to claim 1, wherein the first magnetic field sensing element comprises TMR elements.

11. A method, comprising:
employing a first magnetic field sensing element comprising first and second segments wherein the first and second segments are located at positions to receive magnetic field bias in opposite directions for reducing sensitivity due to misalignment of the first and second segments; and
employing a processing module to receive an output of the magnetic field sensing element.

12. The method according to claim 11, wherein the misalignment is determined from a center of magnetic field generated by a magnet.

13. The method according to claim 11, wherein the misalignment is due to the first and second segments being located at non-equal distances from the center of the magnet field.

14. The method according to claim 11, wherein the first segment is subject to a stronger magnetic field and the second segment is subject to a weaker magnetic field as misalignment increases, and wherein the processing module is configured to combine signals from the first and second segments for reducing sensitivity due to misalignment of the first and second segments.

15. The method according to claim 11, wherein the first magnetic field sensing element comprises a GMR split into two portions.

16. The method according to claim 15, wherein the first and second magnetic field sensing elements are configured in half-bridge configuration.

17. The method according to claim 15, further including employing third and fourth magnetic field sensing elements, wherein the first, second, third, and fourth magnetic field sensing elements are configured in a bridge configuration.

18. The method according to claim 17, wherein the third magnetic field sensing element comprises fifth and sixth segments and the fourth magnetic field sensing element comprises seventh and eighth segments.

19. The method according to claim 11, wherein the first magnetic field sensing element comprises GMR elements.

20. The method according to claim 11, wherein the first magnetic field sensing element comprises TMR elements.

21. A sensor system, comprising:
- a first magnetic field sensing means comprising first and second segments wherein the first and second segments are located at positions to receive magnetic field bias in opposite directions for reducing sensitivity due to misalignment of the first and second segments; and
- a processing means to receive an output of the magnetic field sensing means.

22. The sensor system according to claim 21, wherein the misalignment is determined from a center of magnetic field generated by a magnet.

23. The sensor system according to claim 21, wherein the misalignment is due to the first and second segments being located at non-equal distances from the center of the magnet field.

24. The sensor system according to claim 21, wherein the first segment is subject to a stronger magnetic field and the second segment is subject to a weaker magnetic field as misalignment increases, and wherein the processing means is configured to combine signals from the first and second segments for reducing sensitivity due to misalignment of the first and second segments.

* * * * *